(12) United States Patent
Augustin et al.

(10) Patent No.: US 8,884,643 B2
(45) Date of Patent: Nov. 11, 2014

(54) ELECTRONIC CIRCUIT ARRANGEMENT FOR PROCESSING BINARY INPUT VALUES

(75) Inventors: Michael Augustin, Potsdam (DE); Michael Goessel, Mahlow (DE); Rolf Kraemer, Fuerstenwalde (DE)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 13/557,790

(22) Filed: Jul. 25, 2012

(65) Prior Publication Data

US 2013/0002288 A1  Jan. 3, 2013

Related U.S. Application Data

(63) Continuation of application No. PCT/DE2011/075009, filed on Jan. 24, 2011.

(30) Foreign Application Priority Data

Jan. 29, 2010  (DE) .......................... 10 2010 006 383

(51) Int. Cl.
| | |
|---|---|
| H03K 19/003 | (2006.01) |
| H03K 19/23 | (2006.01) |
| H03K 19/20 | (2006.01) |
| H03K 19/007 | (2006.01) |

(52) U.S. Cl.
CPC .... *H03K 19/00392* (2013.01); *H03K 19/00338* (2013.01); *H03K 19/20* (2013.10); *H03K 19/0075* (2013.01)
USPC .................. 326/11; 326/9; 326/35; 326/110; 327/23

(58) Field of Classification Search
CPC ....... H03K 19/20; H03K 19/02; H03K 19/12; H03K 19/00392; H03K 19/23; H03K 19/17764; H03K 19/00338; H03K 5/26; H03K 17/54; H03K 5/24; B82Y 10/00; G01R 19/0038; G01R 1/28
USPC ............... 326/104, 110, 9–11, 35; 327/23, 50
See application file for complete search history.

(56) References Cited

U.S. PATENT DOCUMENTS

| | | | | |
|---|---|---|---|---|
| 3,582,878 | A | * | 6/1971 | Bossen et al. ................ 714/760 |
| 4,378,683 | A | * | 4/1983 | Matsuda et al. ............... 66/193 |
| 6,624,654 | B1 | | 9/2003 | Trimberger |

(Continued)

OTHER PUBLICATIONS

PCT Search Report dated Jul. 25, 2011 in connection with PCT Patent Application PCT/DE2011/075009.

(Continued)

*Primary Examiner* — Dylan White
(74) *Attorney, Agent, or Firm* — Eshweiler & Associates, LLC

(57) ABSTRACT

Electronic circuit arrangement for processing binary input values x∈X of a word width n (n>1), with a first, second and third combinatory circuit components configured to process the binary input values x to form first, second and third binary output values. The arrangement further includes a majority voter element configured to receive the binary output values and provide a majority signal based on the received binary output values. The second and third combinatory circuit components are designed, as regards faults during processing of the binary input values x in the first combinatory circuit component, to process binary input values of a true non-empty partial quantity $X_1$ of the quantity of binary input values X in a fault-tolerant manner and process binary input values of a further non-empty partial quantity $X_2$ of the quantity of binary input values X different from the true non-empty partial quantity $X_1$ in a fault-intolerant manner.

9 Claims, 10 Drawing Sheets

(56) References Cited

U.S. PATENT DOCUMENTS

Figure 1:
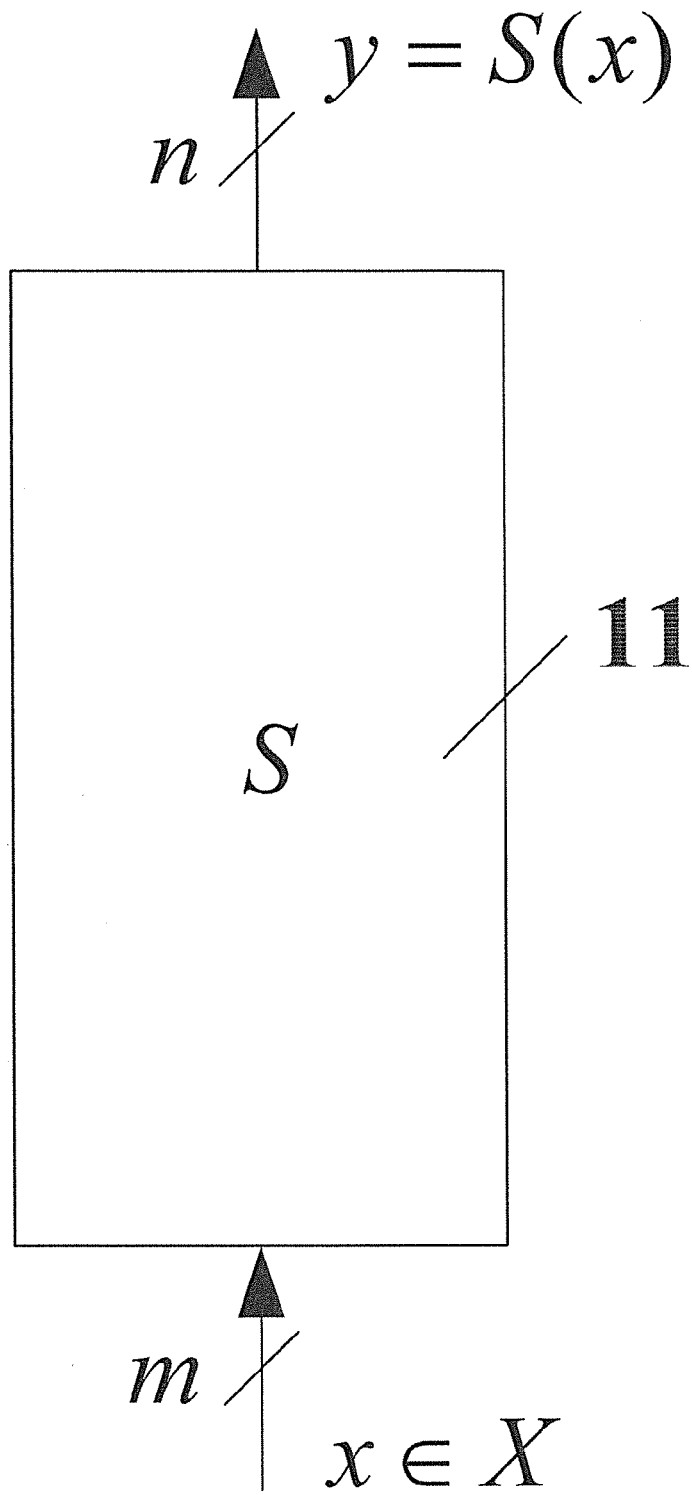

| | | | |
|---|---|---|---|
| 6,910,173 B2 * | 6/2005 | Mitra et al. | 714/760 |
| 7,383,479 B1 * | 6/2008 | Carmichael et al. | 714/725 |
| 7,958,394 B1 * | 6/2011 | Bridgford | 714/25 |
| 7,965,098 B2 * | 6/2011 | Wood et al. | 326/11 |
| 2002/0157071 A1 | 10/2002 | Schiefele | |
| 2007/0018698 A1 | 1/2007 | Nosowicz | |

OTHER PUBLICATIONS

Barry W. Johnson, "Design and Analysis of Fault-Tolerant Digital Systems", University of Virginia, Charlottesville, Jan. 1989, p. 51-55.

Stephen Y.H. Su, et al., "An Overview of Fault-Tolerant Digital System Architecture", Utah State University, National Computer Conference 1977, p. 1-8.

\* cited by examiner

ELECTRONIC CIRCUIT ARRANGEMENT FOR PROCESSING BINARY INPUT VALUES

The disclosure relates to the field of error correction in an electronic circuit.

BACKGROUND

The level of integration of electronic circuits has been increasing for many years. The dimensions of circuit elements such as transistors, the dimensions of connecting structures, current intensity and voltage values are forever getting smaller. As a result of this there has been a rise in error frequency.

It is known to make circuits or parts of a circuit fault-tolerant in respect of a multitude of faults by tripling the circuits. A circuit S is tripled to give three circuits $S_1$, $S_2$ and $S_3$, which are functionally equal to circuit S. The outputs of circuits $S_1$, $S_2$ and $S_3$ are connected to a voter V which performs a majority decision. System triplication also called TMR has been described, for example, in Barry W. Johnson "Designs and Analysis of Fault Tolerant Digital Systems", Addison Wesley Publ. Comp. Reading, Mass., 1989, p. 51-53 and U.S. Pat. No. 6,963,217 B2. A random fault in one of the three partial systems $S_1$, $S_2$ and $S_3$, which for any given input value affects the output of one of circuits $S_1$, $S_2$ or $S_3$, is tolerated by a TMR system.

In practical applications it is sometimes merely necessary for the fault-tolerant system to behave especially reliably only for the input of certain defined values, whilst for other input values no such high reliability of output values is required. For example, a circuit for triggering an airbag in cars should produce the control signals for tripping the airbag with an especially high degree of reliability when inputting the corresponding tripping signal, whilst production of the control signals for opening and closing the central locking system is not subject to such a high reliability requirement.

The disadvantage with the known triplication of a system with voter is the fact that it requires a great deal of hardware, that energy consumption is more than three times as high in comparison to the original system and in that it is not possible to vary the reliability for different input values which from the start require different reliability levels.

SUMMARY

It is an object to propose an improved electronic circuit arrangement comprising a plurality of combinational circuit arrangements for processing binary input values in a fault-tolerant manner, which is realizable but costs less to produce.

An electronic circuit arrangement or device for processing binary input values according to independent claim 1 is provided. Advantageous embodiments are the subject of dependent sub-claims.

Due to the fault-tolerance for input values from a non-empty subset $X_1$ of all input values X and no fault tolerance for input values from a further non-empty subset $X_2$ of all input values X the expenditure for realising the circuit arrangement with respect of the known system triplication and the majority decision can be reduced. It is advantageous if the subset $X_1$ of the input values for which the circuit arrangement is to be fault-tolerant can be fixed in such a way that all necessary requirements as regards the fault tolerance of the circuit arrangement are met. Expenditure on hardware is less since the cost for implementation can be adapted to suit the necessary fault-tolerance.

A further development provides for the second and third combinational circuit components to be further designed to incorporate the following features:

in a fault-free case the second binary output value of the second combinational circuit component and the third binary output value of the third combinational circuit component are equal to the first binary output value of the first combinational circuit component, for all binary input values of the non-empty proper subset $X_1$, for all binary input values from the further non-empty subset $X_2$ the second binary output value of the second combinational circuit component and the third binary output value of the third combinational circuit component are non-equal, and for all binary input values of the subset $X_1$ the following is true for each bit of the first combinational binary output value of word width a1: at least the second binary output value of the second combinational circuit arrangement or at least the third binary output value of the third combinational circuit component is equal to the first binary output value of the first combinational circuit component.

With an advantageous design provision may be made for the second combinational circuit component to be configured so as to process the binary input values x such that the second binary output value is equal to the first binary output value.

One embodiment provides for further combinational circuit components each of which are configured to process the binary input values x to form the first binary output value, and the output of which is respectively connected to an input of the majority voter element. If, for example, two further circuit components are present which process binary input values to form the first binary output values, the fault tolerance for input values from the partial quantity $X_1$ is equal to the fault tolerance of a quintupled system with majority decision without requiring hardware expenditure for a quintupled system with majority decision.

A further development of the invention can provide further majority voter elements whose input for receiving the respective binary output value is connected with the output of all combinational circuit components and which are respectively configured, depending upon the received binary output values, to provide a majority signal at their output. In one design exactly two further majority voter elements are formed. This design enables faults to be tolerated also in a voter element.

With respect to a preferred embodiment, the respective input of all combinational circuit components is serial-connected with an output of a further circuit component, wherein the further circuit component is configured to process binary input values uϵU to form binary output values W which, at least partially, are different from the binary input values xϵX, wherein $X_1 \subset W$. If certain input values of the combinational circuit components are produced with the aid of the serial connected further circuit not as output values, the circuit arrangement provided can realise the fault tolerance only for the actually present input values or for a subset of these input values. The values not occurring as output values of the further circuit provided need not be added to the quantity $X_1$, for which a fault tolerance is required, resulting in a reduction in expenditure for a realisation without the fault tolerance being diminished.

With an advantageous design provision is made for a further combinational circuit component configured to process the binary input values x to form binary control signals and a multiplexer element, wherein the output of the further combinational circuit component carrying the binary control signals is connected with the control input of the multiplexer element, a first data input of the multiplexer element is connected with the output of the first combinational circuit component, and a second data input of the multiplexer element is connected with the output of the majority voter element.

In this design individual faults of the circuit component are tolerated especially advantageously.

A convenient further development may provide for the binary input values of non-empty subset $X_1$ to form a subset of binary input values, so that for a set $\Phi$ of faults $\phi_1, \ldots, \phi_k$ occurring in the first circuit component the following is true: $S(x) \neq S(\phi, x)$ for $x \in X_1$, wherein $S(\phi, x)$ is the binary output value of the first combinational circuit component, if fault $\phi \in \Phi$ is present and the binary input value x is input. In this way the system can be secured against certain faults in critical areas.

One embodiment provides for $X_2 = (X \setminus X_1)$.

In an advantageous design provision is made for the binary output value of the second circuit component to be 1 and for the binary output value of the third combinational circuit component to be 0 for the binary input values from the further non-empty subset $X_2$.

DESCRIPTION OF PREFERRED EMBODIMENTS

Figure 2:
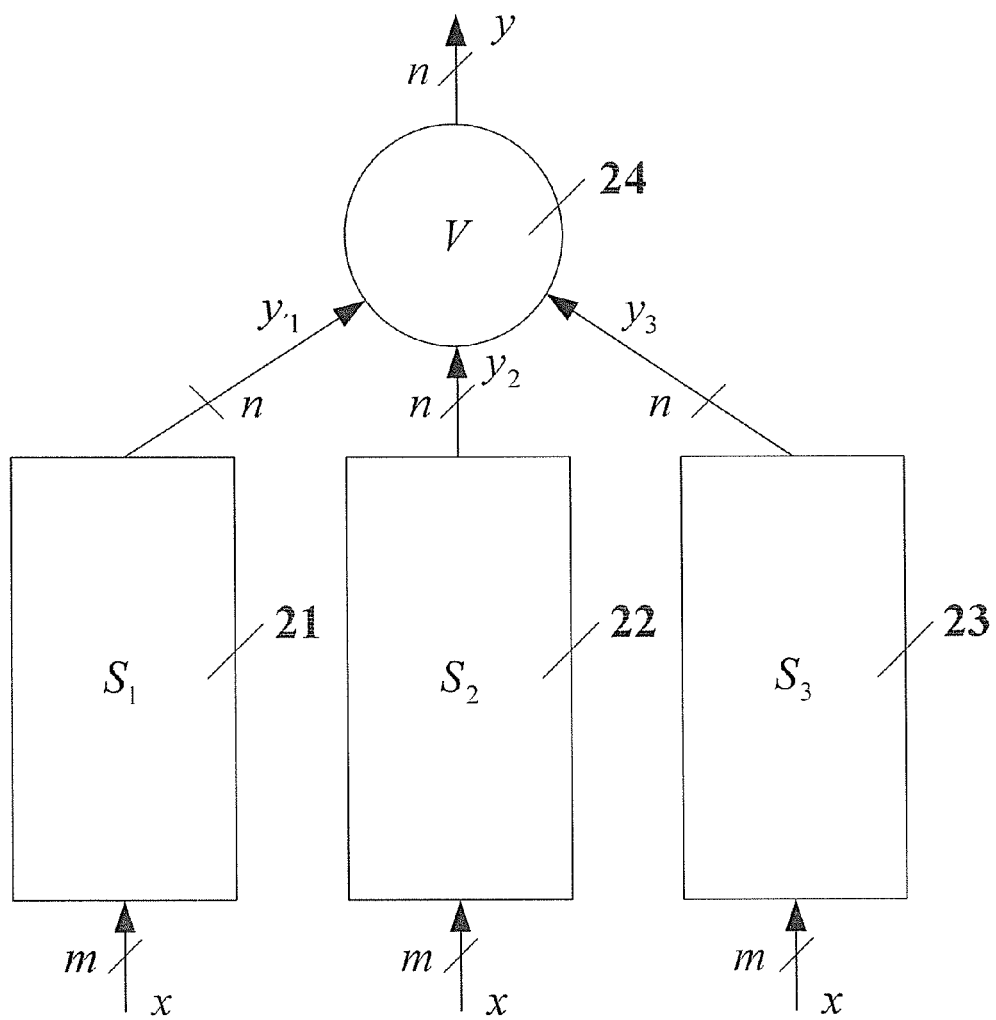
Figure 3:
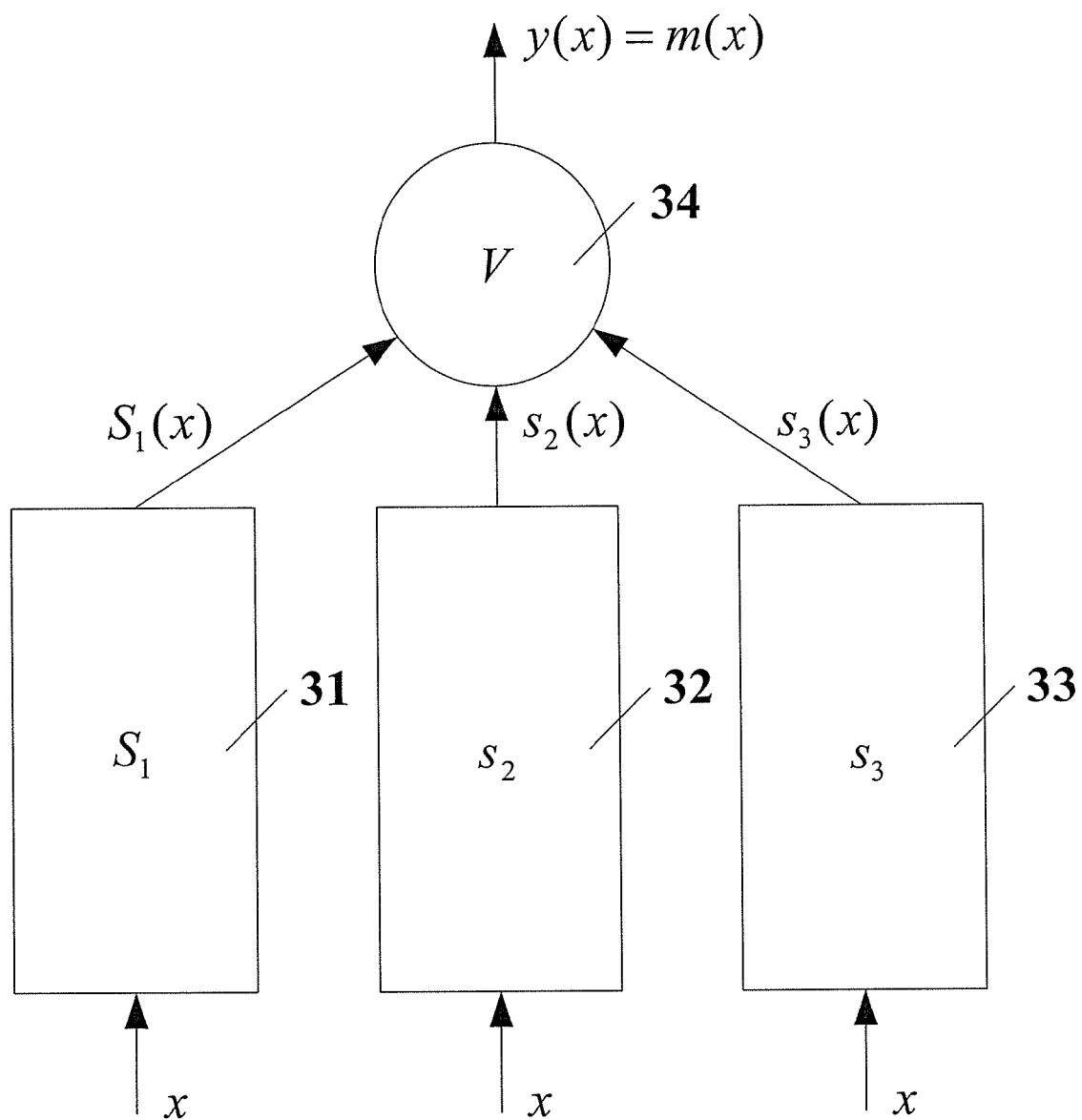
Figure 4:
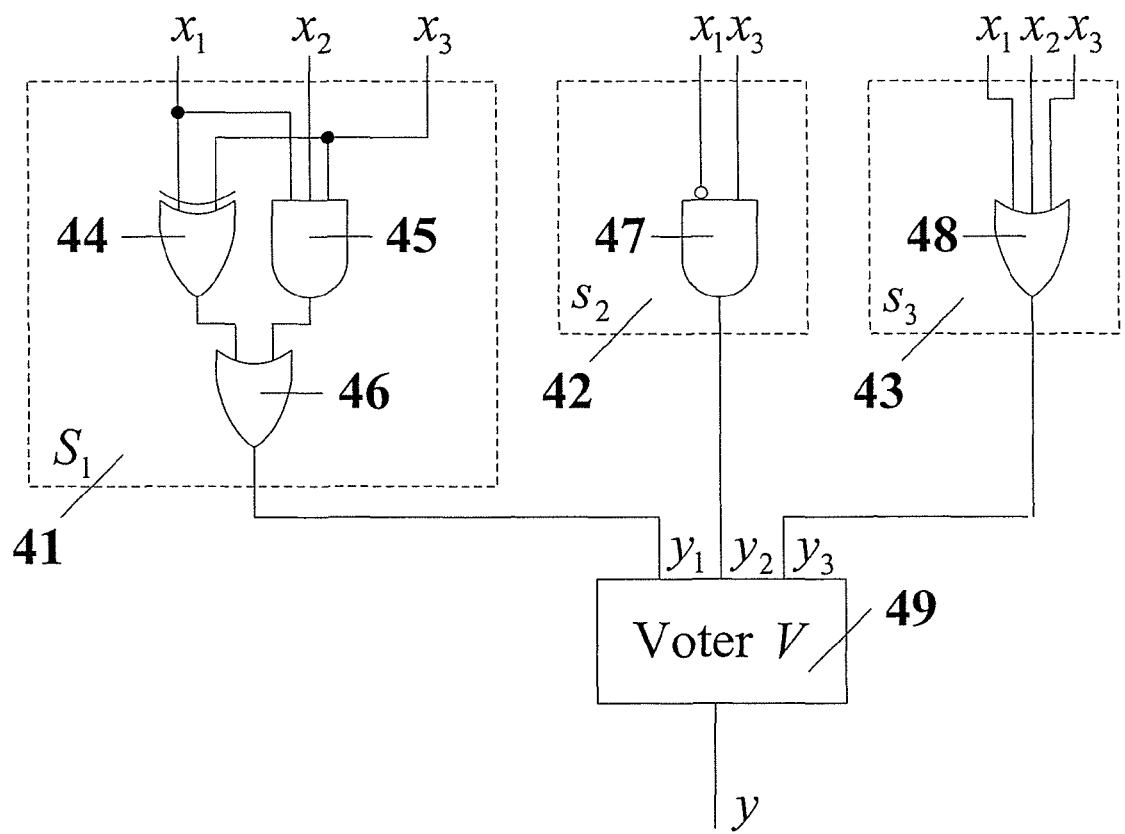
Figure 5:
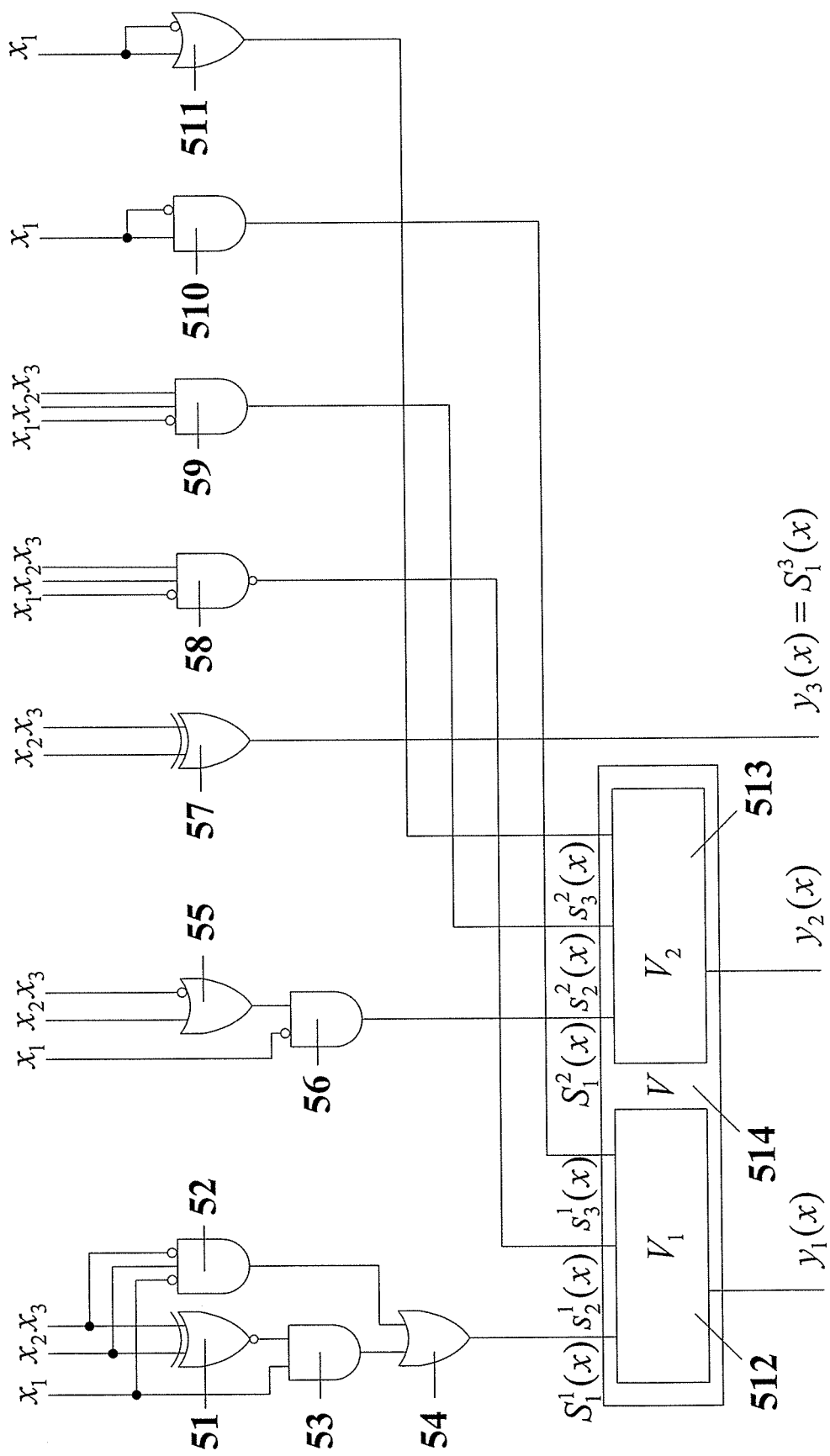
Figure 6:
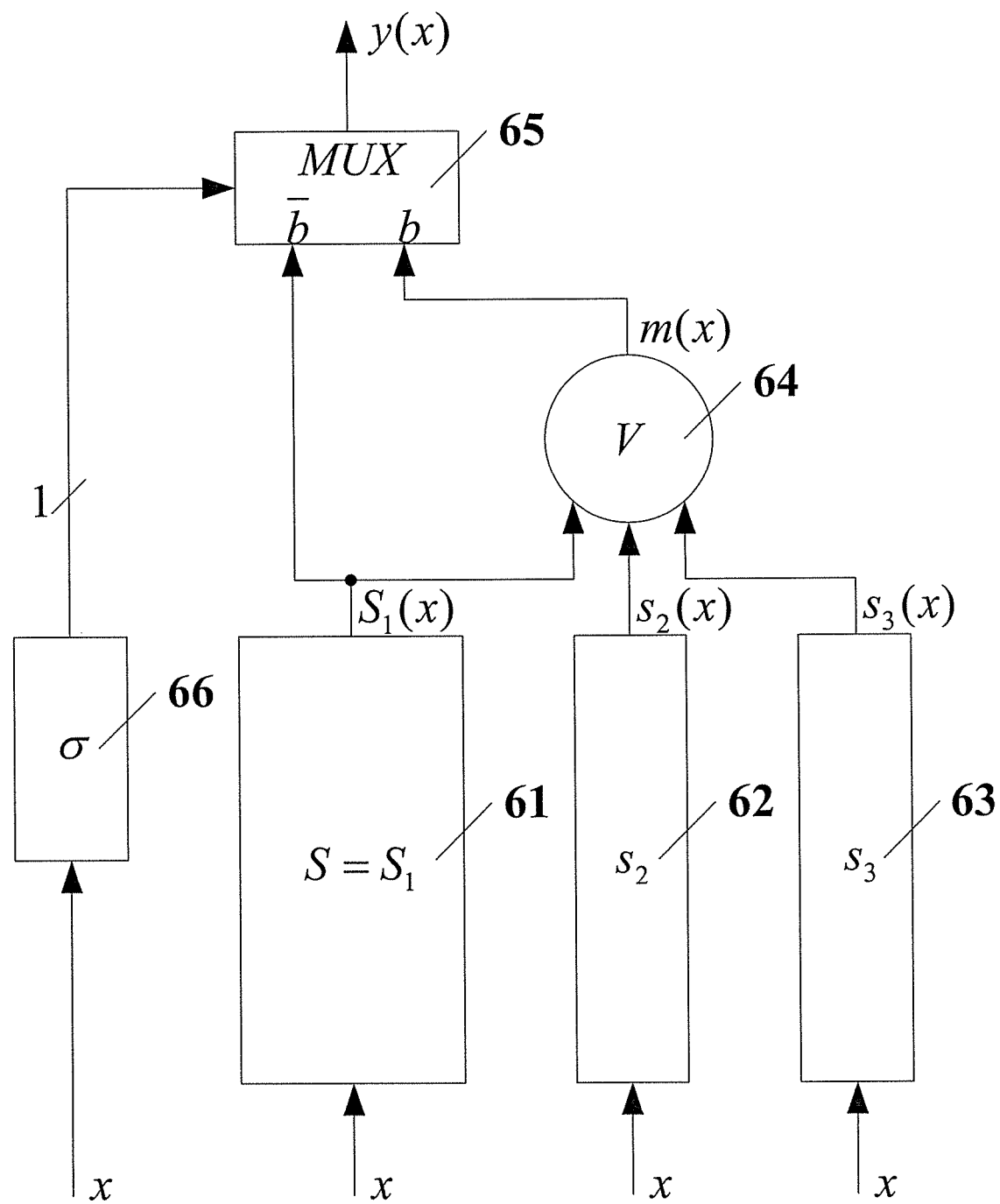
Figure 7:
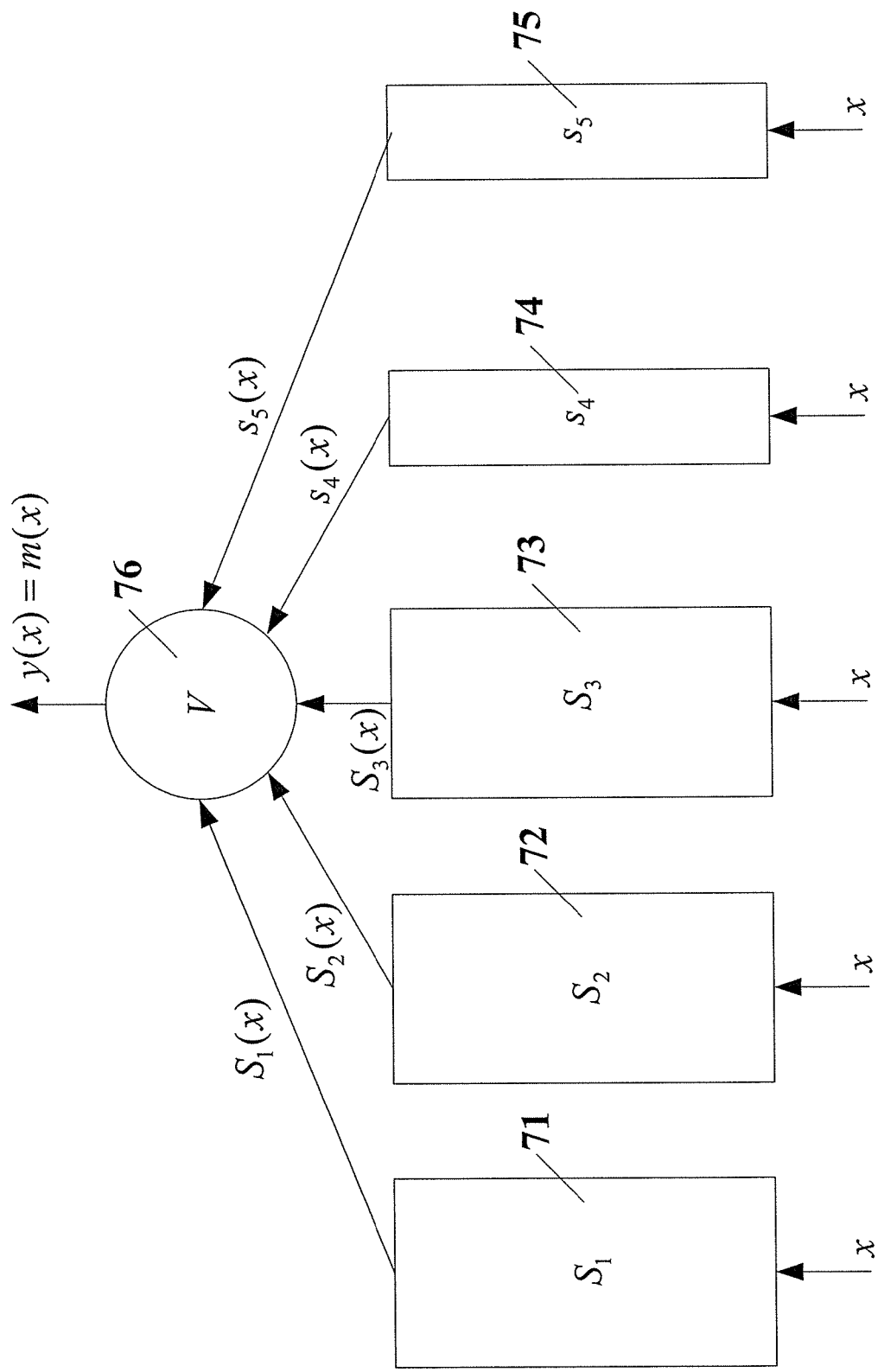
Figure 8:
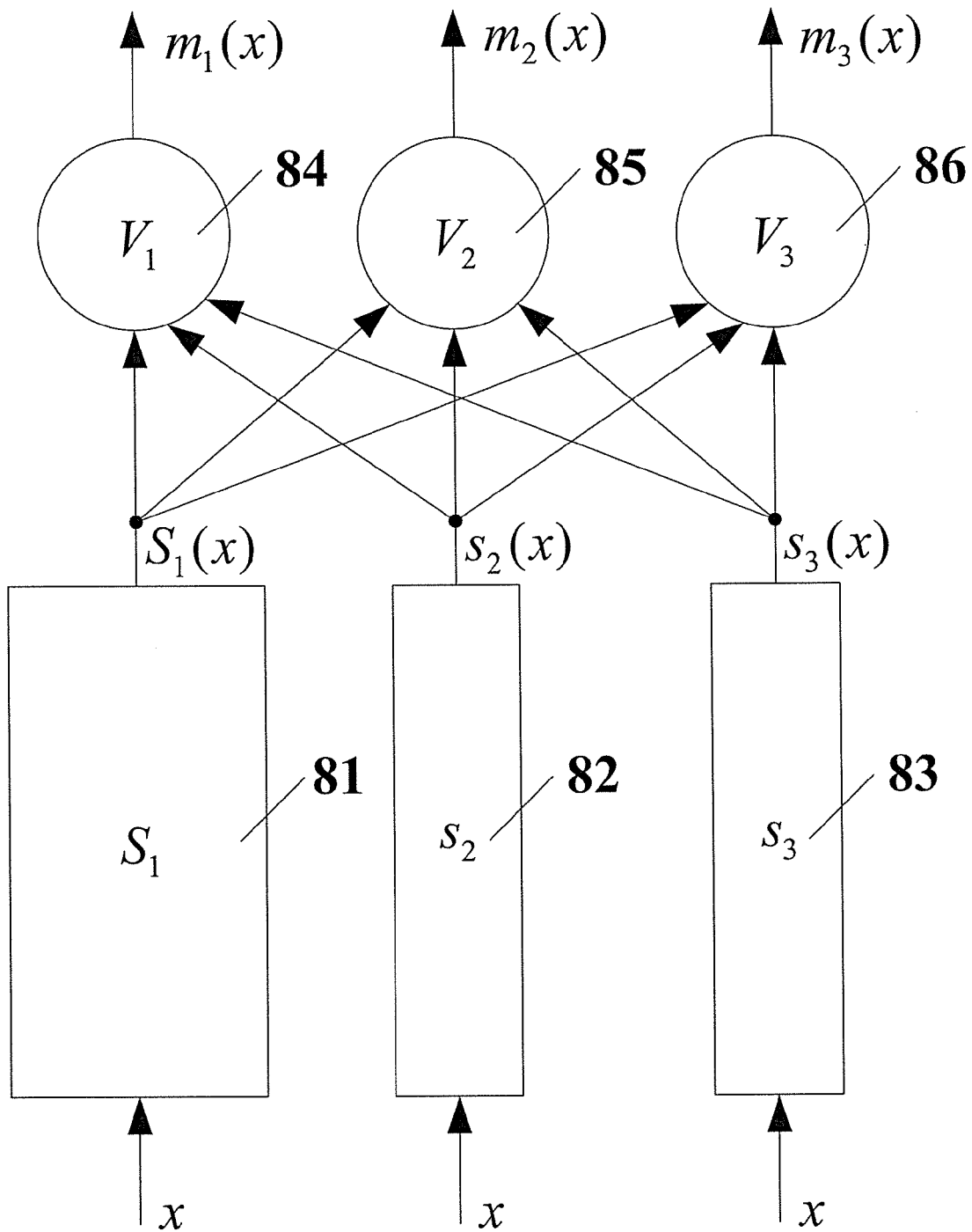
Figure 9:
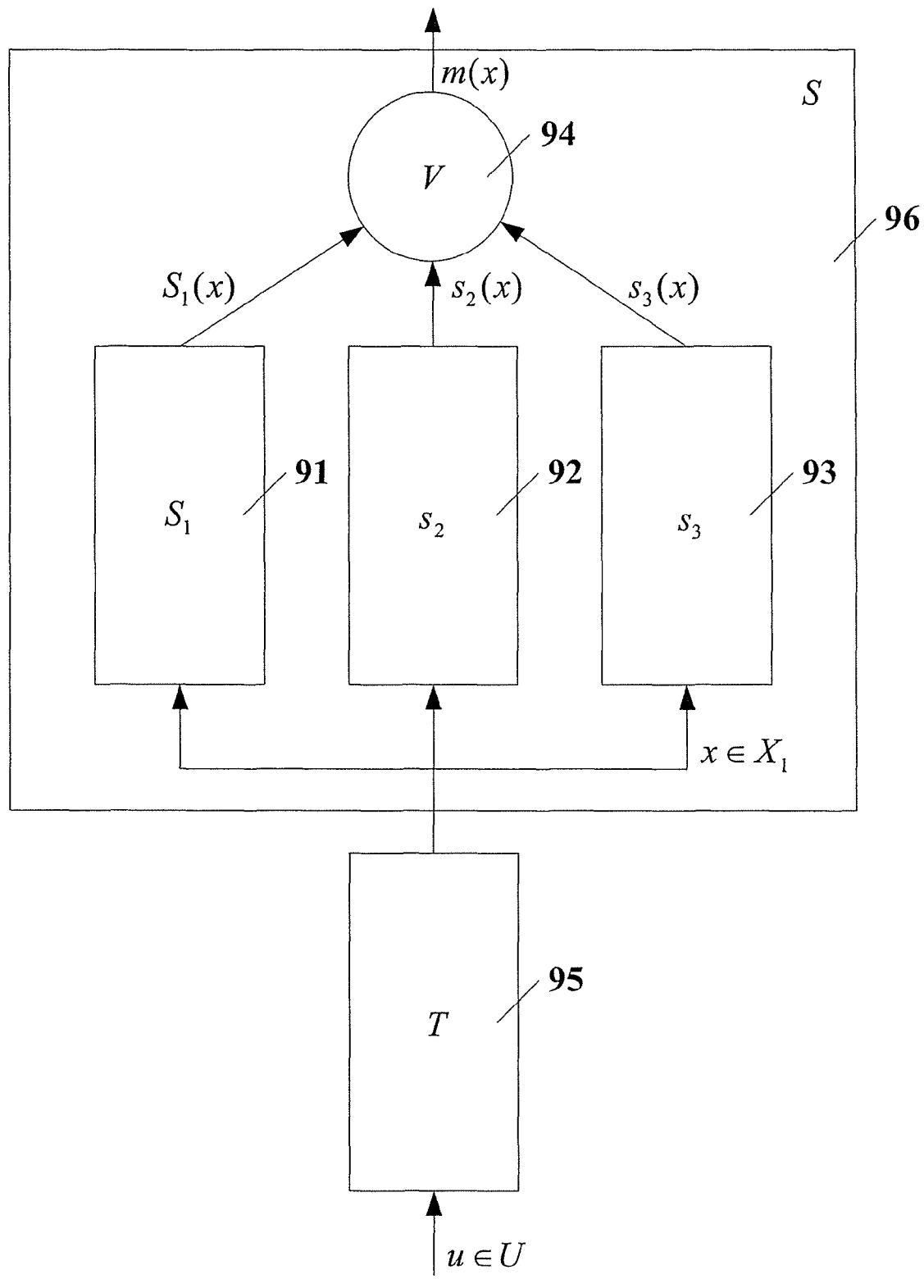
Figure 10:
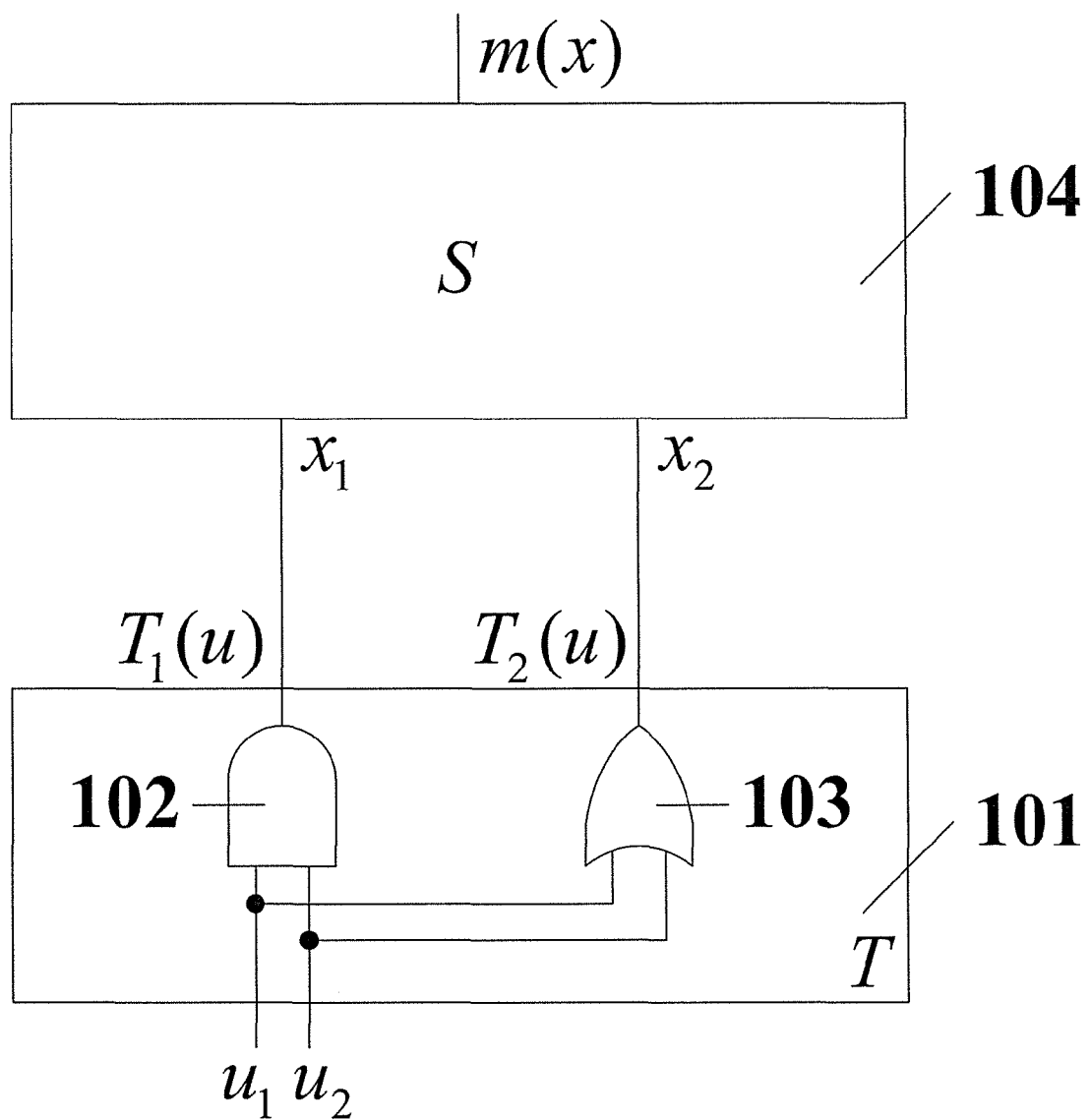

Embodiments will now be explained in more detail with reference to figures of the drawing, in which:

FIG. 1 is a schematic illustration of a known combinational circuit,

FIG. 2 is a schematic illustration of a known combinational circuit with triplification, FIG. 3 is a schematic illustration of a combinational circuit according to one embodiment, FIG. 4 is a schematic illustration of a combinational circuit according to the embodiment of FIG. 3 with a typical circuit implementation, FIG. 5 is a schematic illustration of a combinational circuit according to a further embodiment, FIG. 6 is a schematic illustration of a combinational circuit according to an embodiment with an additional circuit for generating a control signal and with a multiplexer element, FIG. 7 is a schematic illustration of a combinational circuit according to an embodiment with further combinational circuit components, FIG. 8 is a schematic illustration of a combinational circuit according to an embodiment with several voter elements, FIG. 9 is a schematic illustration of a combinational circuit according to an embodiment with an upstream circuit element, and FIG. 10 is a schematic illustration of a further combinational circuit.

FIG. 1 shows a known combinational circuit S 11, which for an input value x from an input set X outputs a value $y=S(x)$, so that the circuit S 11 realises the function $S(x)$. The word width of the input of S 11 is m and the word width of the output is n. Therein: $m > 1$ and $n \geq 1$.

FIG. 2 shows, how according to the state of the art a fault-tolerant so-called TMR (Triple Modular Redundancy) system can be realised from S 11 with $m > 1$ and $n \geq 1$ through system triplication and a voter.

The combinational circuit S 11 of FIG. 1 has been triplicated to form 3 combinational circuits $S_1 21$, $S_2 22$, $S_3 23$. The three circuits $S_1 21$, $S_2 22$ and $S_3 23$ realise the functions $y_1 = S_1(x)$, $y_2 = S_2(x)$ and $y_3 = S_3(x)$, which respectively equal the function $y = S(x)$. Therefore it is true for all $x \in X$ that $S_1(x) = S_2(x) = S_3(x) = S(x)$. The output with a width of n-bit of circuits $S_1 21$, $S_2 22$ and $S_3 23$ are connected to three n-bit wide inputs of a voter V 24, which at its output outputs the n-bit wide signal y. For each bit of its n-bit wide inputs the voter outputs the value which occurs most frequently. If $y_1 = (y_1^1, \ldots, y_1^n)$, $y_2 = (y_2^1, \ldots, y_2^n)$, $y_3 = (y_3^1, \ldots, y_3^n)$, $y = (y^1, \ldots, y^n)$, then for $i = 1, \ldots, n$ the value of $y^i$ is determined as $y^i = (y_1^i \wedge y_2^i) \vee (y_1^i \wedge y_3^i) \vee (y_2^i \wedge y_3^i)$. Voters with 3 or more inputs are known to the expert.

FIG. 3 shows a combinational circuit with a set X of possible input values, which is fault-tolerant for a true or proper subset $X_1 \subset X$ of its input values and whose realisation expenditure is less than a TMR realisation. In contrast to a TMR realisation according to the state of the art such as described in FIG. 2, where the combinational circuit S 11 has been replaced by three functionally equal circuits $S_1 21$, $S_2 22$, $S_3 23$, the combinational circuit S 11 of FIG. 1 in the circuit according to the invention of FIG. 3 has been replaced by three circuits $S_1 31$, $s_2 32$ and $s_3 33$, which are not all functionally identical. The circuits $S_1 31$, $s_2 32$ and $s_3 33$ are also called the first, second and third combinational circuit component of the circuit arrangement according to the invention of FIG. 3. In there $A_1$ with $A_1 = n$ is the number of binary outputs of the first circuit component and $a_1$ is the number of binary outputs of the second and third circuit component, wherein $a_1 \leq A_1$. In order to illustrate the principle of the invention as clearly as possible, it is assumed for FIG. 3 that both $S_1 31$ and $s_2 32$ as well as $s_3 33$ have only one binary output, so that the output word width $a_1$ is equal to 1. Circuit $S_1 31$ realises the same function $y = S_1(x) = S(x)$ as circuit S 11. Circuits $s_2 32$ and $s_3 33$ realise the functions $y_2 = s_2(x)$ and $y_3 = s_3(x)$, wherein for $x \in X_1$: $s_2(x) = s_3(x) = S_1(x)$.

Thus: if the input value x is from the first subset $X_1$ of X, then $S_1 31$, $s_2 32$ and $s_3 33$, in the fault-free case, output the same values respectively. For $x \in (X \setminus X_1)$ at least one of values $s_2(x)$ or $s_3(x)$ output by $s_2 32$ or $s_3 33$ is equal to $S_1(x)$, which is formally expressed by $(s_2(x) = S_1(x)) \vee (s_3(x) = S_1(x))$ for $x \in (X \setminus X_1)$. There is a non-empty subset $X_2 \subseteq (X \setminus X_1)$ of $X \setminus X_1$ for which $s_2(x) \neq s_3(x)$ for $x \in X_2$, and for $x \in X_2$ only two and not all three of values $S_1(x)$, $s_2(x)$ and $s_3(x)$ are equal. Thus for the input values x with $x \in X_1$, as already mentioned: $S_1(x) = s_2(x) = s_3(x)$.

For $x \in X_1$ the circuit arrangement of FIG. 3 has the same fault tolerance characteristics as the circuit arrangement of FIG. 2, whilst the circuit arrangement of FIG. 3 for $x \in X_2$ is not fault-tolerant. Due to the fact that fault tolerance is required only for certain input values and not for all $x \in X$, the fault tolerance characteristics can be accurately adapted and circuit expenditure for the circuit arrangement in FIG. 3 is often surprisingly considerably reduced compared to the circuit expenditure in FIG. 2, which is advantageous.

In table 1 the truth table of a Boolean function $S_1(x) = S_1(x_1, x_2, x_3)$ is shown, which shall be realised by a fault-tolerant circuit arrangement according to FIG. 3. $y = S_1(x)$, $x_1$, $x_2$ and $x_3$ are binary variables.

TABLE 1

| $x_1$ | $x_2$ | $x_3$ | $S_1(x)$ | $X_1$ |
|---|---|---|---|---|
| 0 | 0 | 0 | 0 | + |
| 0 | 0 | 1 | 1 | + |
| 0 | 1 | 0 | 0 | |
| 0 | 1 | 1 | 1 | + |
| 1 | 0 | 0 | 1 | |

TABLE 1-continued

| $x_1$ | $x_2$ | $x_3$ | $S_1(x)$ | $X_1$ |
|---|---|---|---|---|
| 1 | 0 | 1 | 0 | |
| 1 | 1 | 0 | 1 | |
| 1 | 1 | 1 | 1 | |

The set of all possible input values of the circuit is X={000, 001,010,011,100,101,110,111}. The subset of input values $X_1$, for which circuit S is fault-tolerant, is $X_1$={000,001,011}. A possible representation of the Boolean function $S_1(x)$ is for example $$S_1(x)=(x_1 \oplus x_3) \vee (x_1 \wedge x_2 \wedge x_3) \quad (1.1)$$

wherein $\oplus$ stands for the XOR or anti-valence operation, $\vee$ for the OR operation (disjunction) and $\wedge$ for the AND operation (conjunction). Equation (1.1) is checked most simply by inserting all 8 values for $(x_1 x_2 x_3) \in X$. The input values 000, 001 and 011, which belong to $X_1$, are marked in table 1 with + in the column headed $X_1$. In table 2, in addition to the values of function $S_1(x)$ of table 1, the values of functions $s_2(x)$ and $s_3(x)$ have been entered, which are realised by circuits $s_2$ and $s_3$.

TABLE 2

| $x_1$ | $x_2$ | $x_3$ | $S_1(x)$ | $X_1$ | $s_2(x)$ | $s_3(x)$ | $X \backslash X_1$ | $X_2$ |
|---|---|---|---|---|---|---|---|---|
| 0 | 0 | 0 | 0 | + | 0 | 0 | | |
| 0 | 0 | 1 | 1 | + | 1 | 1 | | |
| 0 | 1 | 0 | 0 | | 0 | 1 | + | + |
| 0 | 1 | 1 | 1 | + | 1 | 1 | | |
| 1 | 0 | 0 | 1 | | 0 | 1 | + | + |
| 1 | 0 | 1 | 0 | | 0 | 1 | + | + |
| 1 | 1 | 0 | 1 | | 0 | 1 | + | + |
| 1 | 1 | 1 | 1 | | 0 | 1 | + | + |

The input values belonging to the subsets $X \backslash X_1$ and $X_2$, respectively, are marked by an + in the columns headed $X \backslash X_1$ and $X_2$ respectively. Table 2 shows that the subsets $X \backslash X_1$ and $X_2$ are the same. Possible representations of the Boolean functions $s_2(x)$ and $s_3(x)$ are $$s_2(x)=\overline{x_1} x_3 \quad (1.2)$$

$$s_3(x)=x_1 \vee x_2 \vee x_3 \quad (1.3)$$

FIG. 4 shows an embodiment of the circuit arrangement according to FIG. 3 with circuits S=$S_1$, $s_2$ and $s_3$, which realise the functions $S_1(x)$, $s_2(x)$ and $s_3(x)$ described by table 2 and by equations (1.1), (1.2) and (1.3).

The circuit arrangement of FIG. 4 consists of circuits $S_1$ 41, $s_2$ 42, $s_3$ 43 and a voter V 49. Circuit $S_1$ consists of XOR gate 44, AND gate 45 and OR gate 46. Circuit $s_2$ 42 consists of AND gate 47 and circuit $s_3$ 43 consists of OR gate 48. The input line carrying input signal $x_1$ is connected with the first input of XOR gate 44, the first input of AND gate 45, the first input of OR gate 48 and in a negated manner with the first input of AND gate 47. The input line carrying input signal $x_2$ is connected with the second input of AND gate 45 and with the second input of OR gate 48. The input line carrying input signal $x_3$ is connected with the second input of XOR gate 44, the third input of AND gate 45, the second input of AND gate 47 and the third input of OR gate 48. The output of XOR gate 44 is connected with the first input of OR gate 46, the second input of which is connected with the output of AND gate 45 and whose output carrying the signal $y_1$ is fed into the first input of voter V 49. The output of AND gate 47 carrying the value $y_2$ is connected with the second input of voter V 49. The output OR gate 48 carrying the signal $y_3$ is fed into the third input of voter V 49. Voter V 49 outputs the signal y at its output.

The circuit $S_1$ 41 comprises 3 gates: XOR 44, AND 45 and OR 46, whilst circuit $s_2$ 42 comprises only AND gate 47 and circuit $s_3$ 43 comprises only OR gate 48. It is clear that circuits $s_2$ and $s_3$ require less expenditure for their realisation than $S_1$. If for example input value $(x_1, x_2, x_3)$=001 from the subset $X_1$ is input, gates 46, 47 and 48, in a fault-free case, respectively output the value $y_1=y_2=y_3=1$, which voter V 49 uses for performing the majority decision y=1.

Let it be assumed that a stuck-at-0 fault is present at the first input of OR gate 46, which is connected with the output of XOR gate 44. The value at this input then is constantly 0, and for an input of 001 from $X_1$ the OR gate 46 and thus the circuit $S_1$ 41 outputs the erroneous value 0. Since circuits $s_2$ 42 and $s_3$ 43 are not affected by this fault, they continue to output the value 1 so that voter V 49 forms the correct output value y=1 from its input value $(y_1 y_2 y_3)$=011, whereby the error due to this fault is tolerated.

Similarly errors or faults in the partial circuits $s_2$ or $s_3$ are tolerated when inputting values $x \in X_1$. A fault at the output of circuit $s_2$ 42 may thus be caused in that at the second input of AND gate 47, which carries the signal $x_3$, a stuck-at-0 fault occurs resulting in this input always carrying the value 0. When inputting 001 the output of AND gate 47 then shows the value 0 instead of the correct value 1 and circuit $s_2$ 42 outputs the faulty value 0. Circuits $S_1$ 41 and $s_3$ 43, however, output the respectively correct value of 1, resulting in the voter V 49 generating the correct result y=1.

For the same fault, given an input of 011, a value of 1 is present at the output of XOR gate 44 and a value of 0 is present at the output of AND gate 45, so that the OR gate 46 and thus the circuit $S_1$ 41 outputs a value of 1. The output of OR gate 48 and thus the output of circuit $s_3$ 43 also show a value of 1. The output of AND gate 47 and thus the output of circuit $s_2$ 42 shows a value of 0. The voter V 49 forms the majority signal 1 from the signals 101 present at its inputs, and the error or fault of circuit $s_2$ 42 is tolerated for an input of 011 from the subset $X_1$. Thus the general result is that each error due to a fault affecting only one of partial circuits $S_1$, $s_2$ or $s_3$ is tolerated for an input of an arbitrary $x \in X_1$ by the circuit according to FIG. 4.

In a further embodiment a combinational circuit S with 3 inputs $x_1$, $x_2$, $x_3$ and $A_1$=3 binary outputs $y_1$, $y_2$, $y_3$ shall now be considered. The combinational circuit S realises the three Boolean functions $S_1^1(x)=y_1$, $S_1^2(x)=y_2$, $S_1^3(x)=y_3$ the table of values of which are shown in table 3. Thus $x=(x_1,x_2,x_3)$, and the three Boolean functions $S_1^1(x)$, $S_1^2(x)$, $S_1^3(x)$ are combined to form $S_1(x)=(S_1^1(x), S_1^2(x), S_1^3(x))$. The first output of circuit S, which implements function $S_1^1(x)$, is supplemented by two further outputs of additional circuits $s_2^1$ and $s_3^1$, which implement the Boolean functions $s_2^1(x)$ und $s_3^1(x)$. The second output of circuit S, which implements the function $S_1^2(x)$, is supplemented by two further outputs of additional circuits $s_2^2$ und $s_3^2$, which implement the Boolean functions $s_2^2(x)$ and $s_3^2(x)$. The third output of circuit S, which implements the function $S_1^3(x)$, is not supplemented by further outputs, since no fault tolerance is required for this circuit output. The first circuit component thus realises the Boolean functions $S_1^1(x)$, $S_1^2(x)$ and $S_1^3(x)$ at their $A_1$=3 binary outputs. The second circuit component realizes the Boolean functions $s_2^1(x)$ und $s_2^2(x)$ at their $a_1$=2 binary outputs, whilst the third circuit component realizes the Boolean functions $s_3^1(x)$ and $s_3^2(x)$ at their $a_1$=2 binary outputs. The fault tolerance here is realised only for the output values of word width $a_1$=2, which are output at the first two binary outputs of all $A_1=3$ circuit outputs of circuit component $S_1$. The second and third circuit components $s_2$ and $s_3$ therefore comprise only $a_1=2$ binary circuit outputs, respectively.

For $X_1=\{011\}$, i.e. for the input value 011, a circuit arrangement according to the invention is to be determined, which is fault-tolerant for the first two outputs $y_1$ und $y_2$. No fault-tolerance is provided for input values $X\backslash X_1=\{000,001, 010,100,101,110,111\}$. Independently of any input no fault-tolerance may be required for output $y_3$.

TABLE 3

| $x_1$ | $x_2$ | $x_3$ | $S_1^1(x)=y_1$ | $S_1^2(x)=y_2$ | $S_1^3(x)=y_3$ | $X_1$ |
|---|---|---|---|---|---|---|
| 0 | 0 | 0 | 0 | 1 | 0 | |
| 0 | 0 | 1 | 0 | 0 | 1 | |
| 0 | 1 | 0 | 1 | 1 | 1 | |
| 0 | 1 | 1 | 0 | 1 | 0 | + |
| 1 | 0 | 0 | 1 | 0 | 0 | |
| 1 | 0 | 1 | 0 | 0 | 1 | |
| 1 | 1 | 0 | 0 | 0 | 1 | |
| 1 | 1 | 1 | 1 | 1 | 0 | |

Table 4 shows a truth table for the functions $S_1^1(x)$, $S_1^2(x)$, $S_1^3(x)$, $s_2^1(x)$, $s_2^2(x)$, $s_3^1(x)$, $s_3^2(x)$, which meets the fault-tolerance requirements for input value 011. Table 4 reveals that the following applies to $x=(011)\in X_1=\{011\}$:

$$S_1^1(011)=s_2^1(011)=s_3^1(011)=0$$

$$S_1^2(011)=s_2^2(011)=s_3^2(011)=1.$$

In other respects the following applies to all $x\in(X\backslash X_1)$, $$[S_1^1(x)=s_2^1(x)] \text{ or } [S_1^1(x)=s_3^1(x)]$$

and $$[S_1^2(x)=s_2^2(x)] \text{ or } [S_1^2(x)=s_3^2(x)].$$

TABLE 4

| $x_1$ | $x_2$ | $x_3$ | $S_1^1(x)$ | $S_1^2(x)$ | $S_1^3(x)$ | $s_2^1(x)$ | $s_2^2(x)$ | $s_3^1(x)$ | $s_3^2(x)$ | $X_1$ |
|---|---|---|---|---|---|---|---|---|---|---|
| 0 | 0 | 0 | 0 | 1 | 0 | 1 | 0 | 0 | 1 | |
| 0 | 0 | 1 | 0 | 0 | 1 | 1 | 0 | 0 | 1 | |
| 0 | 1 | 0 | 1 | 1 | 1 | 1 | 0 | 0 | 1 | |
| 0 | 1 | 1 | 0 | 1 | 0 | 0 | 1 | 0 | 1 | + |
| 1 | 0 | 0 | 1 | 0 | 0 | 1 | 0 | 0 | 1 | |
| 1 | 0 | 1 | 0 | 0 | 1 | 1 | 0 | 0 | 1 | |
| 1 | 1 | 0 | 0 | 0 | 1 | 1 | 0 | 0 | 1 | |
| 1 | 1 | 1 | 1 | 0 | 0 | 1 | 0 | 0 | 1 | |

At least one of values $s_2^1(x)$ or $s_3^1(x)$ matches $S_1^1(x)$ and at least one of values $s_2^2(x)$ or $s_3^2(x)$ matches $S_1^2(x)$, which can easily be checked using table 4. Again, it is very easy to check by repeating the calculation or by using a commonly used synthesis tool that $$y_1=S_1^1(x)=\overline{x_1}x_2\overline{x_3} \vee x_1(\overline{x_2\oplus x_3})$$

$$y_2=S_1^2(x)=\overline{x_1}(x_2 \vee \overline{x_3})$$

$$y_3=S_1^3(x)=x_2\oplus x_3$$

$$s_2^1(x)=\overline{\overline{x_1}x_2x_3}$$

$$s_2^2(x)=\overline{x_1}x_2x_3$$

$$s_3^1(x)=0$$

$$s_3^2(x)=1$$

are possible realisations of the functions shown in table 4.

FIG. 5 shows a corresponding circuit arrangement which is fault-tolerant especially for input value $x_1x_2x_3=011$ at the first two outputs $y_1$ and $y_2$. The circuit S for implementing the Boolean functions $S_1^1(x)$, $S_1^2(x)$ and $S_1^3(x)$ comprises gates 51, 52, 53, 54, 55, 56 and 57. The circuit for implementing the Boolean functions $s_2^1(x)$ and $s_2^2(x)$ comprises gates 58 und 59. The circuit for implementing the Boolean functions $s_3^1(x)$ und $s_3^2(x)$ comprises gates 510 und 511. The output of gate 510 still shows the value 0 and the output of gate 511 still shows the value 1. It can be recognised that hardware expenditure for realising the functions $s_2^1$, $s_2^2$ and $s_3^1$, $s_3^2$ is less than the expenditure for realising the functions $S_1^1$ and $S_2^1$.

The input line carrying the binary signal $x_1$ is fed in non-negated form into the first input of AND gate 53, AND gate 510 and OR gate 511, respectively. In negated form $x_1$ is fed into the first input of AND gate 52, AND gate 56, NAND gate 58, AND gate 59, respectively, and into the second input of AND gate 510 and OR gate 511, respectively. The input line carrying the binary signal $x_2$ is fed into the first input of XNOR gate 51, into the second input of AND gate 52, into the first input of OR gate 55, into the first input of XOR gate 57, into the second input of NAND gate 58 and into the second input of AND gate 59. The line carrying the binary signal $x_3$ is connected in non-negated form with the second input of XNOR gate 51, the second input of XOR gate 57, the third input of NAND gate 58, the third input of AND gate 59 and connected in negated form with the third input of AND gate 52 and the second input of OR gate 55.

The output of XNOR gate 51 is connected with the second input of AND gate 53, whose output is fed into the first input of an OR gate 54.

The output of AND gate 52 is connected with the second input of OR gate 54, whose output carries the value $S_1^1(x)$ and is fed into the first input of voter $V_1$ 512.

The output of OR gate 55 is connected with the second input of AND gate 56, whose output carries the signal $S_1^2(x)$ and is connected with the first input of voter $V_2$ 513.

The output of XOR gate 57 carries the value $y_3(x)$ which is output by circuit S. The output of NAND gate 58 carries the signal $s_2^1(x)$ and is connected with the second input of voter $V_1$ 512, whilst the output of AND gate 59 carrying the signal $s_2^2(x)$ is connected with the second input of voter $V_2$ 513.

The output of AND gate 510 carrying the here constant signal $s_3^1(x)$, is connected with the third input of voter $V_1$ 512, whilst the output of OR gate 511 carrying the here constant signal $s_3^2(x)$ is connected with the third input of voter $V_2$ 513. The voter $V_1$ 512 outputs, at its output, the output value $y_1(x)$, whilst the voter $V_2$ 513 outputs the output value $y_2(x)$ at its output. The voters $V_1$ 512 and $V_2$ 513, which perform a bit-by-bit majority decision, are combined in FIG. 5 to form one voter V 514. The output of XOR gate 57 is an output of the circuit carrying the output signal $y_3(x)$. This output is not implemented so as to be fault-tolerant.

The outputs of voters $V_1$ 512 and $V_2$ 513 carrying the signals $y_1(x)$ and $y_2(x)$ respectively are the circuit outputs which are implemented so as to be fault-tolerant. Voters $V_1$ 512 and $V_2$ 513 performing a majority decision across the three inputs present at their inputs are combined to form one voter V 514 with 6 inputs and 2 outputs. Voter $V_1$ 512 performs a majority decision across its values $S_1^1(x)$, $s_2^1(x)$, $s_3^1(x)$ present at its inputs and voter $V_2$ 513 performs a majority decision across its values $S_1^2(x)$, $s_2^2(x)$, $s_3^2(x)$ present at its inputs.

The circuit of FIG. 5 is fault-tolerant at outputs $y_1$ and $y_2$ for input value 011. If this input is present at the inputs, this results in $S_1^1(0,1,1)=0$, $s_2^1(0,1,1)=0$, $s_3^1(0,1,1)=0$ and $S_1^2(0,1,1)=1$, $s_2^2(0,1,1)=1$, $s_3^2(0,1,1)=1$. If in case of a fault one of values $S_1^1(0,1,1)$, $s_2^1(0,1,1)$ or $s_3^1(0,1,1)$ is in error, such an error is tolerated due to the majority decision of voter $V_1$ 512. Similarly: if in case of a fault only one of values $S_1^2(0,1,1)$, $s_2^2(0,1,1)$, $s_3^2(0,1,1)$ is in error, this error is tolerated by $V_2$ 513.

For an input of 100 the result in a fault-free case is $S_1^1(1,0,0)=1$, $s_2^1(1,0,0)=1$ and $s_3^1(1,0,0)=0$, resulting in voter $V_1$ 512 generating the correct value $y_1(1,1,0)=1$. Now, if a stuck-at-0 fault is present at the first input of AND gate 53, which carries the value $x_1=1$, the first and second inputs of OR gate 54 show the value 0, resulting in this gate outputting the faulty value 0 at its output, with the result that voter $V_1$ 512 processes the input 0,1,0 into 0. For an input of $(1,0,0) \in X_2$ the fault is not tolerated. Output $y_3$ formed by the output of XOR gate 57 is not implemented so as to be fault-tolerant.

Analogously this leads to the circuit of FIG. 5 being fault-tolerant for an input of $(0,1,1) \in X_1$ at its second output, which carries the signal $y_2(x)$, since as already mentioned, $S_1^2(0,1,1)=1$, $s_2^2(0,1,1)=1$ and $s_3^2(0,1,1)=1$.

FIG. 6 shows a further design of a combinational circuit arrangement. The combinational circuit $S=S_1$ 61 is supplemented by two combinational circuits $s_2$ 62 and $s_3$ 63. Combinational circuit $S_1$ 61 is the first combinational circuit component, combinational circuit $s_2$ 62 is the second combinational circuit component and combinational circuit $s_3$ 63 is the third combinational circuit component of the circuit arrangement according to the invention. The set of possible input values of circuit S is designated with X. The set of input values for which the circuit arrangement of FIG. 6 is fault-tolerant is designated with $X_1$. $X_1$ is a true or proper subset of X. The circuit arrangement is defined such that $$S(x)=S_1(x)=s_2(x)=s_3(x) \text{ for } x \in X_1 \text{ with } X_1 \subset X$$

and $$(S_1(x)=s_2(x)) \text{ or } (S_1(x)=s_3(x)) \text{ for } x \in X$$

wherein there exists a non-empty subset $X_2 \subseteq (X \backslash X_1)$ so that $$s_1(x) \neq s_2(x) \text{ for } x \in X_2.$$

Also present are a combinational circuit σ66 for realising a Boolean function σ(x) and a multiplexer MUX 65. The Boolean function σ(x) is defined as $$\sigma(x) = \begin{cases} b \text{ for } x \in X_1 \\ \overline{b} \text{ for } x \in X_2 \\ \text{arbitrary in all other cases} \end{cases}$$

In this formula b is a fixed value which can be fixed to be 0 or 1. If $x \in (X \backslash (X_1 \cup X_2))$, then σ(x) can be specified arbitrary. An expert would define σ(x) for $x \in (X \backslash (X_1 \cup X_2))$ depending on the requirement by a CAD tool in such a way that circuit σ occupies as small an area as possible for implementing the Boolean function σ(x). The output of combinational circuit $S_1$ 61 carrying the signal $S_1(x)$ is fed into the first input of a voter V 64, at the second input of which is connected the output of combinational circuit $s_2$ 62 carrying the signal $s_2(x)$ and at the third input of which is connected the output of combinational circuit $s_3$ 63 carrying the signal $s_3(x)$. The output of voter V 64 carrying the signal m(x), which represents the majority of values of $S_1(x)$, $s_2(x)$ and $s_3(x)$ is connected with a first data input of multiplexer MUX 65, into the second data input of which is fed the output of combinational circuit $S_1$ 61 and whose data output carries the signal y(x). The control input of multiplexer MUX 65 is connected with the output of combinational circuit σ66 carrying the control signal σ(x).

In the following it is assumed that b=1 for the description of the mode of operation of the circuit arrangement of FIG. 6, in order to simplify the description. Analogously a description for b=0 is also possible. If $x \in X_1$, then σ(x)=1 and the multiplexer MUX 65 connects its corresponding 1-input with its output so that y(x)=m(x). Moreover $S_1(x)=s_2(x)=s_3(x)$ is applicable and voter V 64 determines the value $m(x)=S_1(x)=s_2(x)=s_3(x)$, which is fed to output y(x).

Individual faults of individual circuit components will now be considered. If only one of output values $S_1(x)$, $s_2(x)$ or $s_3(x)$ for $x \in X_1$ is faulty, this faulty value will be corrected by the majority decision of the voter and the correct value y(x) is output. If the control value σ(x) generated by circuit σ66 is equal to 0 which is faulty, the correct value $S_1(x)$ is forwarded to the output of multiplexer MUX 65 and y(x)=S(x) is again correct. If $x \in X_2$, then σ(x)=0 and the output of circuit $S_1$ 61 is forwarded to the output of multiplexer 65, so that $y(x)=S_1(x)$. Now if output value $S_1(x)$ is faulty, the faulty value is sent to the output of the circuit arrangement. This is the only case, in which a fault at one of the circuit components S 61, $s_2$ 62, $s_3$ 63, σ66 results in an error at the output value y(x). Further individual faults of the listed circuit components do not have any effect.

Any faults in voter 64 and in multiplexer 65 have nothing to do with the subject of the patent claims and are therefore not addressed here.

For example, if a fault-tolerance of the combinational circuit S with respect to a set of technical faults $\{\phi_1, \ldots, \phi_k\}=\Phi$ shall be achieved, the set $X_1$ has to be selected such, that $X_1$ contains all input values, for which an arbitrary fault $\phi \in \Phi$ impacts upon the output behaviours of $S_1$.

As a typical example for determining the Boolean functions σ(x), $s_2(x)$, $s_3(x)$ a combinational circuit S with $S=S_1(x)=S_1(x_1,x_2,x_3,x_4)=x_2 x_3 \vee x_2(x_1 \oplus x_4) \wedge x_1 \overline{x_2} x_3 x_4$ shall be considered, which shall be fault-tolerant for the set of input values $X_1=\{0000,0010,0111,1110,1111\}$. The first combinational circuit component with $A_1=a_1=1$ realises the Boolean function $S_1(x)$, the second combinational circuit component realises the Boolean function $s_2(x)$ and the third combinational circuit component realises the Boolean function $s_3(x)$.

Table 5, in the first four columns, shows the input values for $x_1$, $x_2$, $x_3$, $x_4$ and in the fifth column the functional values of the Boolean function $S_1(x)$. In the sixth column those lines are marked with +, for whose input assignments the circuit arrangement according to the invention shall be fault-tolerant. These are the first, third, eighth, fifteenth and sixteenth line. For the input assignments 0000, 0010, 0111, 1110 and 1111 corresponding to these lines the values of the Boolean functions $s_2(x)$ and $s_3(x)$ are identical and they also match with $S_1(x)$, so that $$S_1(x)=s_2(x)=s_3(x) \text{ for } x \in X_1.$$

Next the still-to-be-determined functional values of the Boolean function $s_2(x)$ can be arbitrarily fixed in principle. In order to simplify realisation an expert would optimise $s_2(x)$ with the functional values fixed for $x \in X_1$, by applying a commonly used synthesis tool. To this end he would, for example, select all still undefined functional values of $s_2(x)$ as don't-care and thus optimise the given partially defined Boolean function, as is common.

For example, let it be assumed that $s_2(x)$ is defined as $s_2(x)=x_2(x_3 \wedge x_4)$. For this function the functional values are entered in column 8 of table 5. It will now be described how the Boolean function $s_3(x)$ can be defined.

$x \in X_1$ is defined as $s_3(x)=S_1(x)$, as is the function $s_2(x)$. Thus: $s_3(0000)=S_1(0000)=0$, $s_3(0010)=S_1(0010)=0$, $s_3(0111)=S_1(0111)=1$, $s_3(1110)=S_1(1110)=1$, $s_3(1111)=S_1(1111)=1$. For the input values x, which are defined as $s_2(x) \neq S_1(x)$, $s_3(x)=S_1(x)$ is set. Table 5 shows that the inequality $s_2(x) \neq S_1(x)$ for $x \in \{1011,1100,1101\}$ is satisfied. Thus: $s_3(1011)=S_1(1011)=1$, $s_3(1100)=S_1(1100)=1$ and $s_3(1101)=S_1(1101)=0$. The still-to-be-fixed values $s_3(x)$ may again be arbitrarily fixed at random. An expert would set all of the still-to-be-fixed values of $s_3(x)$ to be don't-care. In a concrete case these are the values for $s_3(0001)$, $s_3(0011)$, $s_3(0100)$, $s_3(0101)$, $s_3(0110)$, $s_3(1000)$, $s_3(1001)$, $s_3(1010)$ for which don't-care values can be set. Then he would optimise the described partially defined Boolean function using a commonly used CAD tool for example, as is common when circuits are designed.

TABLE 5

| $x_1$ | $x_2$ | $x_3$ | $x_4$ | $S_1(x)$ | $X_1$ | $X_2$ | $s_2(x) = x_2(x_3 \vee x_4)$ | $s_3(x) = \overline{x_1}x_2 \vee x_1(x_3 \vee x_2\overline{x_4})$ | $\sigma(x) = \overline{\overline{x_1}\overline{x_2} \vee x_2 x_3}$ |
|---|---|---|---|---|---|---|---|---|---|
| 0 | 0 | 0 | 0 | 0 | + |   | 0 | 0 | 1 |
| 0 | 0 | 0 | 1 | 0 |   |   | 0 | 0 | 1 |
| 0 | 0 | 1 | 0 | 0 | + |   | 0 | 0 | 1 |
| 0 | 0 | 1 | 1 | 0 |   |   | 0 | 0 | 1 |
| 0 | 1 | 0 | 0 | 0 |   | + | 0 | 1 | 0 |
| 0 | 1 | 0 | 1 | 1 |   |   | 1 | 1 | 0 |
| 0 | 1 | 1 | 0 | 1 |   |   | 1 | 1 | 1 |
| 0 | 1 | 1 | 1 | 1 | + |   | 1 | 1 | 1 |
| 1 | 0 | 0 | 0 | 0 |   |   | 0 | 0 | 0 |
| 1 | 0 | 0 | 1 | 0 |   |   | 0 | 0 | 0 |
| 1 | 0 | 1 | 0 | 0 |   | + | 0 | 1 | 0 |
| 1 | 0 | 1 | 1 | 1 |   | + | 0 | 1 | 0 |
| 1 | 1 | 0 | 0 | 1 |   | + | 0 | 1 | 0 |
| 1 | 1 | 0 | 1 | 0 |   | + | 1 | 0 | 0 |
| 1 | 1 | 1 | 0 | 1 | + |   | 1 | 1 | 1 |
| 1 | 1 | 1 | 1 | 1 | + |   | 1 | 1 | 1 |

For example, let it be assumed that $s_3(x)$ was determined to be $s_3(x)=\overline{x_1}x_2 \wedge x_1(x_3 \wedge x_2\overline{x_4})$. The functional values of this function $s_3(x)$ have been entered into column 9 of table 5.

There now follows a description, how function $\sigma$ is defined, which is illustrated in column 10 of table 5. In the lines marked with + in the column headed $X_1$, the value of $\sigma(x)$ equals 1. These are the first, third, eighth, fifteenth and sixteenth lines, which are allocated to the assignments 0000, 0010, 0111, 1110 and 1111. In the lines in which $s_2(x)$ and $s_3(x)$ are not equal, the value of $\sigma(x)$ equals 0. These are the fifth, eleventh, twelfth, thirteenth and fourteenth lines, which are allocated to the assignments 0100, 1010, 1011, 1100 and 1101. All still-to-be-fixed values are again to be selected as arbitrary values or don't-care. As is common in circuit design, a CAD tool can again be used to define the function $\sigma$, which matches the values already fixed in column 10. For example, let it be assumed that $\sigma$ has been defined to be $\sigma(x)=\overline{x_1 x_2} \vee x_2 x_3$. The functional values of this function have been entered in column 10 of table 5.

As a result, the following is true

If $x \in X_1$, then follows $\sigma(x)=1$ (lines 1, 3, 8, 15, 16)
If $\sigma(x)=1$, then follows $S_1(x)=s_2(x)=s_3(x)$ (lines 1, 2, 3, 4, 7, 8, 15, 16)
If $s_2(x) \neq s_3(x)$, then follows $\sigma(x)=0$ (lines 5, 11, 12, 13, 14)
If $\sigma(x)=0$, then follows $s_2(x)=s_3(x)=S_1(x)$ (e.g. line 9) or $s_2(x) \neq s_3(x)$ (e.g. line 5)

The set of input values $X_2$, for which $s_2(x) \neq s_3(x)$, is marked with a + in column 7 headed $X_2$. They form the set $\{0100, 1010,1011,1100,1101\}=X_2$. Furthermore the following applies:

$$(X \backslash X_1)=\{0001,0011,0100,0101,0110,1000,1001,1010, 1011,1100,1101\},$$

$$(X \backslash X_1) \supset X_2,$$

$$X_2=\{0100,1010,1011,1100,1101\}$$

where $X_2$ is a proper subset of $X \backslash X_1$. It should not be difficult for an expert to implement the corresponding Boolean functions as combinational circuits.

FIG. 7 shows a further design of a circuit arrangement for realising a fault-tolerant combinational circuit S, which realises a particularly effective fault-tolerance. In FIG. 7 the combinational circuit S is realised three times as $S_1 71$, $S_2 72$ and $S_3 73$ with identical functions, resulting in $$S(x)=S_1(x)=S_2(x)=S_3(x) \text{ for } x \in X$$

applying to all $x \in X$ from the set of possible input values.
$X_1$ is the partial quantity of input values, for which a particularly high fault-tolerance shall be achieved. The three circuits $S_1 71$, $S_2 72$ and $S_3 73$ are supplemented by the two combinational circuits $s_4 74$ and $s_5 75$, resulting in $$S(x)=s_4(x)=s_5(x) \text{ for } x \in X_1$$

$$(S(x)=s_4(x)) \text{ or } (S(x)=s_5(x)) \text{ for } x \in X$$

wherein again a non-empty partial quantity $X_2 \subseteq (X \backslash X_1)$ exists, resulting in $$s_4(x) \neq s_5(x) \text{ for } x \in X_2$$

The same input value x is present at each of the combinational circuits $S_1 71$, $S_2 72$, $S_3 73$, $s_4 74$ and $s_5 75$. For i=1, 2, 3 the output of combinational circuit S, carrying the output signal $S_i(x)$ is fed into the i-th input of voter V 76. The output of combinational circuit $s_4$ carrying the output signal $s_4(x)$ is fed into the fourth input of voter V 76, whilst the output of combinational circuit $s_5$ carrying the output signal $s_5(x)$ is connected with the fifth input of voter V 76. The voter V 76 with 5 inputs outputs the value $m(x)=y(x)$ at its output, wherein $m(x)$ is the value, which most frequently occurs at the 5 inputs of voter V 76.

If $x \in X_1$, in a fault-free case, 5 identical values are present at the input of voter V 76 and up to two faulty values are tolerated by the circuit in FIG. 7 as output of $S_1 71$, $S_2 72$, $S_3 73$, $s_4 74$ and $s_5 75$. If $x \in X_2$, in a fault-free case, 4 identical values are present at the input of voter V 76 as output of $S_1 71$, $S_2 72$, $S_3 73$, $s_4 74$ and $s_5 75$ and one faulty value is tolerated by the circuit in FIG. 7.

For $x \in X_1$ the circuit arrangement of FIG. 7 has the fault-tolerance characteristics of a fault-tolerant system, wherein the original system is five times implicated, and for $x \in (X \backslash X_1)$ of at least of a system where the original system is triplicated, wherein expenditure is less than for the system which is five times implicated.

The first combinational circuit component $S_1 71$ realises the function $S_1(x)$, the second combinational circuit component $s_4 74$ realises the function $a_4(x)$ and the third combinational circuit component $s_5 75$ realises the function $s_5(x)$. These circuit components are supplemented by two further combinational circuit components $S_2 72$ and $S_3 73$, which also realise the same function, respectively, as the first circuit component.

FIG. 8 shows a further embodiment of a fault-tolerant circuit arrangement. The circuits $S_1 81$, $s_2 82$ and $s_3 83$ are identical with circuits $S_1 31$, $s_2 32$ and $s_3 33$ of FIG. 3. In FIG. 8 a voter is present three times as voter $V_1 84$, $V_2 85$ and $V_3 86$.

The output of combinational circuit $S_1(x)$ carrying the signal $S_1(x)$ is simultaneously fed into the respectively first inputs of voters $V_1 84$, $V_2 85$ and $V_3 86$. The output of combinational circuit $s_2 82$ carrying the signal $s_2(x)$ is simultaneously fed into the respectively second inputs of voters $V_1 84$, $V_2 85$ and $V_3 86$, whilst the output of circuit $s_3 83$ carrying the signal $s_3(x)$ is connected with the respectively third inputs of voters $V_1 84$, $V_2 85$ and $V_3 86$. The voters $V_1 84$, $V_2 85$ and $V_3 86$ output the majority signals $m_1(x)$, $m_2(x)$ and $m_3(x)$ respectively. If one voter is faulty, most of the majority signals are correct.

FIG. 9 shows a further fault-tolerant circuit arrangement. The circuit arrangement of FIG. 9 comprises a circuit S 96, which is fault-tolerant with respect to the input set $X_1$ and which has a circuit T 95 arranged upstream of it. The circuit S 96 comprises the circuits $S_1 91$, $s_2 92$ and $s_3 93$ and a voter V 94, as described with reference to FIG. 3.

The circuit T 95 processes input values u from a quantity U of inputs into output values T(u), which form the set of output values W of circuit T 95. k, k≥2 stands for the word width of the output of circuit T 95, which is simultaneously connected with the m-bit wide inputs of circuits $S_1 91$, $s_2 92$ and $s_3 93$, wherein m=k. The set of possible inputs in principle of circuit S 96 is $X=\{0,1\}^k$, i.e. the set of all k-digit binary vectors.

If the circuit T 95 is designed in such a way that W is a proper subset of X, then $X_1 \subset W$ is selected in FIG. 9, and the circuit S is fault-tolerant for all input values from the set $X_1$, wherein $X_1$ is a proper subset of W.

The output of circuit T 95 is connected simultaneously with the inputs of circuits $S_1 91$, $s_2 92$ and $s_3 93$. The output of circuit $S_1 91$ is connected with the first input of a voter V 94 with three inputs. The output of circuit $s_2 92$ is connected with the second input of voter V 94 and the output of circuit $s_3 93$ is connected with the third input of voter V 94, which at its output outputs a majority signal m(x).

A circuit T 101, which processes input values $u=u_1 u_2 \in \{00, 01, 10, 11\}$ into output values $T(u)=T_1(u)T_2(u)=x_1 x_2 \in \{00,01,11\} \in \{00,01,10,11\}$, is shown in FIG. 10. The set $\{00,01,11\}$ of output values of circuit T 101 is a proper subset of the set $X=\{0,1\}^2=\{00,01,10,11\}$ of all possible input values of circuit S 104. It is thus possible, to select $X_1$ as a subset of $W=\{00,01,11\}$, for example as $X_1=\{00, 01\}$, for which the circuit S 104 is a fault-tolerant circuit according to the invention.

The circuit T 101 comprises an AND gate 102 and an OR gate 103, into which the input values $u=u_1 u_2 \in \{00,01,10,11\}$ are input and which are processed by the circuit T 101 into the output values $T(u)=T_1(u)T_2(u) \in \{00,01,11\}$. The input of circuit T 101 carrying the first component $u_1$ of the input value u is connected with the respectively first input of gates AND 102 and OR 103, into whose respective second input is fed the input of circuit T 101 carrying the second component $u_2$ of input value u. The AND gate 102 outputs the first component $T_1(u)$ and the OR gate 103 outputs the second component $T_2(u)$ of output value T(u).

The features of the invention disclosed in the above description, in the claims and in the drawing can be important both individually and in any given combination to the implementation of the invention in its various embodiments.

The invention claimed is:

1. An electronic circuit arrangement for processing binary input Values x∈X of word width n(n>1), comprising:
   a first combinational circuit component configured to process the binary input values x to form a first binary output value of word width $a_1(a_1 \geq 1)$ and to provide the first binary output value at the output of the first combinational circuit component, the output of the first combinational circuit component being provided with a number of binary outputs $A_1(A_1>1)$, wherein $A_1 \geq a_1$,
   a second combinational circuit component configured to process the binary input values x to form a second binary output value,
   a third combinational circuit component configured to process the binary input values x to form a third binary output value, and
   a majority voter element, the input of which, for receiving the respective binary input values, is connected with the outputs of the first, second and third combinational circuit components, the majority voter element being configured to provide a majority signal at its output in dependence on the received binary output values,
   wherein the second and third combinational circuit components are configured, as regards faults during processing of the binary input values x in the first combinational circuit component, to process, for the first binary output value of word width $a_1$,
   binary input values of a true non-empty subset $X_1$ of the set of binary input values X in a fault-tolerant manner and
   binary input values of a further non-empty subset $X_2$ of the set of binary input values X in a non-fault-tolerant manner, the further non-empty partial quantity $X_2$ being different from the true non-empty subset $X_1$;
   wherein the second and third combinational circuit components are designed to incorporate the following features:
   in a fault-free case the second binary output value of the second combinational circuit component and the third binary output value of the third combinational circuit component are equal to the first binary output value of the first combinational circuit component, for all binary input values of the non-empty proper subset $X_1$;
   for all binary input values from the further non-empty subset $X_2$ the second binary output value of the second combinational circuit component and the third binary output value of third combinational circuit component are non-equal, and
   for all binary input values of the subset $X_1$ the following is true:
   for each bit of the first binary output value of word width a1: at least the second binary output value of the second combinational circuit component or at least the third binary output value of the third combinational circuit component is equal to the first binary output value of the first combinational circuit component.

2. Circuit arrangement according to claim 1, wherein the second combinational circuit component is configured to process the binary input values x such that the second binary output value is equal to the first binary output value.

3. Circuit arrangement according to claim 1, wherein further combinational circuit components are configured to process the binary input values x to form the first binary output value, and the output of which is respectively connected to an input of the majority voter element.

4. Circuit arrangement according to claim 1, comprising further majority voter elements the input of which, for receiving the respective binary output value, is connected with the output of all combinational circuit components and which are respectively configured, depending upon the received binary output values, to provide a majority signal at their output.

5. Circuit arrangement according to claim 1, wherein the respective input of all combinational circuit components is serial-connected with an output of a further circuit component, wherein the further circuit component is configured to process binary input values $u \in U$ to form binary output values W which, at least partially are different from the binary input values $x \in X$, wherein $X_1 \subset W$.

6. Circuit arrangement according to claim 1, further comprising:
 a further combinational circuit component configured to process the binary input values x to form binary control signals, and
 a multiplexer element, wherein
 the output of the further combinational circuit component carrying the binary control signals is connected with the control input of the multiplexer element,
 a first data input of the multiplexer element is connected to the output of the first combinational circuit component, and
 a second data input of the multiplexer element is connected with the output of the majority voter element.

7. Circuit arrangement according to claim 1, wherein the binary input values of non-empty subset $X_1$ form a subset of binary input values, so that for a set $\Phi$ of faults $\phi_1, \ldots, \phi_k$ occurring in the first circuit component, the following is true: $S(x) \neq S(\phi,x)$ for $x \in X_1$, wherein $S(\phi,x)$ is the binary output value of the first combinational circuit component, if the fault $\phi \in \Phi$ is present and the binary input value x is input.

8. Circuit arrangement according to claim 1, wherein $X_2 = (X \setminus X_1)$.

9. Circuit arrangement according to claim 1, wherein the binary output value of the second circuit component is to be 1 and wherein the binary output value of the third combinational circuit component is to be 0 for the binary input values from the further non-empty subset $X_2$.

* * * * *